United States Patent
Sanduleanu et al.

(10) Patent No.: US 6,798,308 B2
(45) Date of Patent: Sep. 28, 2004

(54) LC CONTROLLABLE OSCILLATOR, A QUADRATURE OSCILLATOR AND A COMMUNICATION ARRANGEMENT

(75) Inventors: Mihai Adrian Tiberiu Sanduleanu, Eindhoven (NL); Etienn Robert Gerald Dugast, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 39 days.

(21) Appl. No.: 10/073,728

(22) Filed: Feb. 11, 2002

(65) Prior Publication Data

US 2002/0167366 A1 Nov. 14, 2002

(30) Foreign Application Priority Data

Feb. 12, 2001 (EP) .............................................. 01200475

(51) Int. Cl.[7] ................................................. H03L 1/00
(52) U.S. Cl. .................. 331/175; 331/177 R; 331/185; 331/117 R; 331/117 FE; 331/167
(58) Field of Search ............................. 331/175, 177 R, 331/185, 117 R, 117 FE, 167

(56) References Cited

U.S. PATENT DOCUMENTS

| | | | |
|---|---|---|---|
| 5,561,398 A | 10/1996 | Rasmussen | ............... 331/36 C |
| 5,818,306 A | 10/1998 | Lee et al. | .................... 331/117 |
| 5,959,504 A | 9/1999 | Wang | .......................... 331/117 |
| 6,016,082 A | 1/2000 | Cruz et al. | .................. 331/117 |
| 6,225,871 B1 * | 5/2001 | Chien | ................... 331/117 FE |
| 6,268,777 B1 * | 7/2001 | Welch | .................. 331/117 FE |

OTHER PUBLICATIONS

Hajimiri A et.al. "Design Issues in CMOS Differential LC Oscillators" IEEE Journal of Solid–State Circuits, IEEE Inc. New York, US vol. 34, No. May 5, 1999 pp. 717–724 XP000908586.

* cited by examiner

*Primary Examiner*—Arnold Kinkead
(74) *Attorney, Agent, or Firm*—Aaron Waxler

(57) ABSTRACT

A LC controllable oscillator (LCCO) according to the invention comprises a voltage-controlled oscillator (VCO) and a first voltage controlled current source (VCCS) of a first type for supplying a current to the VCO. The VCO is realized with a flit pair of VCCCS of the first type coupled with a second paw of VCCS of a second type end a LC resonator. The VCO generates a periodical oscillation frequency that is controllable by a control signal (V). The LCCO further comprises a replica scaled bias module (RSBM) supplied from the external voltage source. The RSBM is conceived to generate a control signal (BIAS CONTROL) for controlling the supplied current delivered by the first VCCS to the VCO.

6 Claims, 4 Drawing Sheets

LC CONTROLLABLE OSCILLATOR, A QUADRATURE OSCILLATOR AND A COMMUNICATION ARRANGEMENT

FIELD OF THE INVENTION

The invention relates to a LC controllable oscillator (LCCO) comprising a voltage controlled oscillator (VCO), a first voltage controlled current source (VCCS) of a first type for supplying a current to the VCO, the VCO being realized with a first pair of VCCS of the first type coupled with a second pair of VCCS of a second type and a LC resonator adapted to be controlled for generating a periodical oscillation frequency which is controllable by a control signal (V), further comprising a first (SUP) conductor and a second (REF) conductor for connection to an external direct voltage source (VS).

The invention further relates to a module and an arrangement that uses the LCCO.

BACKGROUND OF THE INVENTION

The following is defined in this description: if a VCCS of the first type is considered that sources it's output current then a VCCS of the second type sinks it's output current. Furthermore, if a VCCS of the first type is considered that sinks it's output current then a VCCS of the second type sources it's output current.

LC oscillators are well known circuits that are used in a large spectrum of applications for generating periodical signals. When they are used in high frequency applications as optical fiber networks, mobile telephony, transceivers and many others, they must provide, among other qualities, a good stability of the periodical signals versus temperature modification, they must be controllable over a wide frequency range of the periodical signals, and so on.

The LC oscillators are preferred in high frequency applications because of their frequency accuracy and reduced phase margin noise they exhibit. These LC oscillators have as their main components a pair of active devices, transistors for example and a LC tank circuit that determines their oscillation frequency.

Such an oscillator is disclosed in U.S. Pat. No. 5,959,504. It comprises a first pair of CMOS transistors with a tunable voltage applied to the back gate terminals for varying the parasitic capacitance of the transistor pair. The circuit further comprises a current generating means or a second transistor pair having a similar configuration but of opposite polarity to the first transistor pair that is connected to the first transistor pair and across an inductor. The frequency of the oscillation is determined by the product between the inductor inductance and the parasitic capacitance of the first pair of transistors. It should be pointed out here that the oscillation frequency is determined by technology dependent parameters as the CMOS parasitic capacitance and the frequency is controlled with a voltage applied at the back gate of the CMOS transistors, being dependent on a specific type of active device. Furthermore no measures are considered for thermally compensation of the oscillator.

SUMMARY OF THE INVENTION

It is therefore an object of the present invention to provide a LC oscillator with means to improve the temperature behavior of the frequency of the oscillation, the frequency of oscillation being determined independently of the technology.

In accordance with the invention this is achieved in a device as described in introductory paragraph characterized in that the LCCO further comprises a replica scaled bias module (RSBM) supplied from the external voltage source via the first conductor (SUP) and the second conductor (REF), the RSBM being conceived to generate a control signal (BIAS CONTROL) for controlling the supplied current delivered by the first VCCS to the VCO.

The LCCO according to the invention has the advantage of a frequency independent of technology and a better thermal stabilization.

In an embodiment of the invention the RSBM comprises a second, a third and a fourth VCCS, the second and the third VCCS being of the first type, the fourth VCCS being of the second type.

The VCCS used in the RSBM are replicas at a different scale of that used in the VCO, the currents circulating through them being proportional to each other. For example, if a current sourced or sinked by a VCCS is $I_0$ then the replica scaled VCCS sources or sinks a current $I_0/m$, m being the scale factor.

The BIAS CONTROL signal modifies in the same way the supply current of the VCO and it's replica current in the RSBM module with the process and temperature variations. In this way the common mode voltage of the first pair of VCCS and of the second pair of VCCS is maintained constant. This improves the thermal stability and the phase noise margin of the LCCO.

In an embodiment the RSBM further comprises a current source of the first type coupled with a fifth VCCS of second type for providing a reference voltage to a first input of a differential voltage controlled voltage source (VCVS).

A second input of the VCVS is coupled with the fourth VCCS for supplying the signal (BIAS CONTROL) for controlling the supplied current in the VCO.

It should be pointed out here that the current source and the fifth VCCS may be regarded as a band gap reference voltage source that provides a better temperature behavior of the circuit. Furthermore, if the control signal V is generated using this band gap reference voltage, the oscillation frequency stability versus temperature is improved, too.

In a preferred embodiment of the invention, a LC tank circuit determines the frequency of oscillation that is controlled by an external control signal (V). The L and C components of the tank circuit have their inductance and capacitance much bigger than any other parasitic inductance and capacitance in the circuit and, as a matter of consequence, the oscillation frequency is determined independently of the technology.

It should be pointed out here that depending on the type the L and C components of the LC tank circuit it's oscillation frequency can be controlled electrically, mechanically, thermally, optically.

Illustratively, all the previously described stages may be realized with transistors and LC tank resonators. In an embodiment all these transistors may be implemented in CMOS technology.

It is another object of the present invention to provide a module comprising the LCCO coupled with a phase shifter, controlled by the control signal (V), the phase shifter providing a first intermediate signal (S1) and a second intermediate signal (S2) to an adder (SUM), in which the intermediate signals S1 and S2 are added to each other for obtaining a signal (S) that is amplified by a first wide band amplifier (TIA) obtaining a first output signal (I), and to a subtraction circuit (DIF) where the intermediate signals S1 and S2 are subtracted from each other for obtaining a signal (D) that is amplified by a second wide band amplifier for obtaining a second output signal (Q).

The module is characterized in that the signals S1 and S2 are mutually phase shifted with 90 degrees.

The module is further characterized in that the output signals (I) and (Q) are periodical and mutually in quadrature.

Furthermore it is another object of the present invention to provide a communication arrangement for communicating via a bi-directional communication channel, characterized in that it comprises a receiver that comprises a data and clock recovery (DCR) circuit comprising a module as claimed in claim 6, the receiver being arranged for generating an output vector of signals by combining a received signal (IN) received from the channel with the periodical signals (I) and (Q), the arrangement further comprising an emission module for emitting an emission signal (OUT) to the channel, the emission module generating the emission signal by combining the periodical signals (I) and (Q) with an input signal vector (IN1) in a phase locked loop (PLL) circuit that contains the module.

The above and other features and advantages of the invention will be apparent from the following description of exemplary embodiments of the invention with reference to the accompanying drawings, in which:

DETAILED DESCRIPTION OF THE PRIMARY EMBODIMENT

Figure 1:
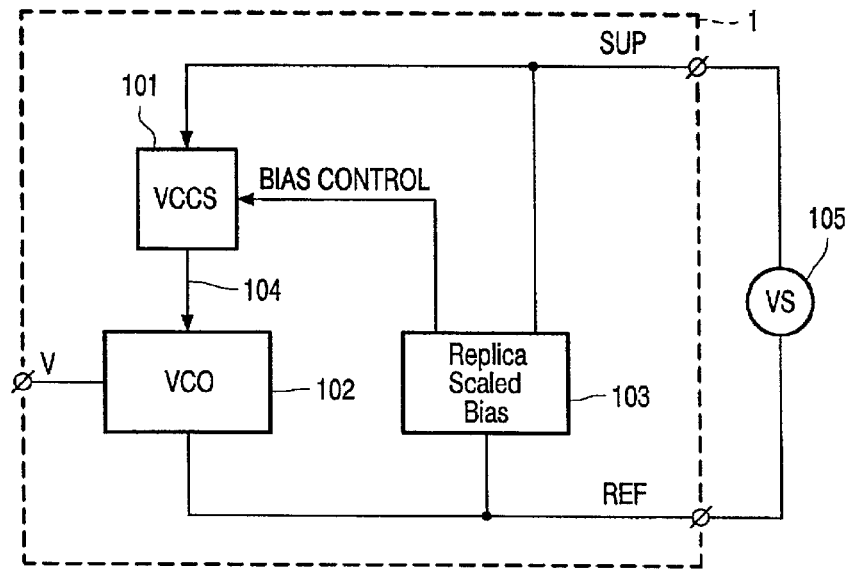
FIG. 1 depicts a block diagram of a LC controllable oscillator (LCCO), according to the invention.

FIG. 1 shows the block diagram of a LC controllable oscillator (LCCO), according to the invention. There is a voltage controlled oscillator (VCO) 102 which is supplied with a current 104 via a VCCS 101 of a first type. The current 104 is controlled by a signal BIAS CONTROL supplied by a Replica Scaled Bias module (RSBM) 103. There are also provided two wires, a first wire labeled SUP and a second wire labeled REF to realize a connection between the LCCO and an external direct current source 105. A control signal V controls the oscillation frequency of the LCCO. If the VCCS 101 sources it's output current then the SUP wire is connected to the positive node of the source 105 and the wire REF is the negative node of the source 105. If the VCCS 101 sinks it's output current then the SUP wire is connected to the negative node of the source 105 and the wire REF is the positive node of the source 105.

Figure 2:
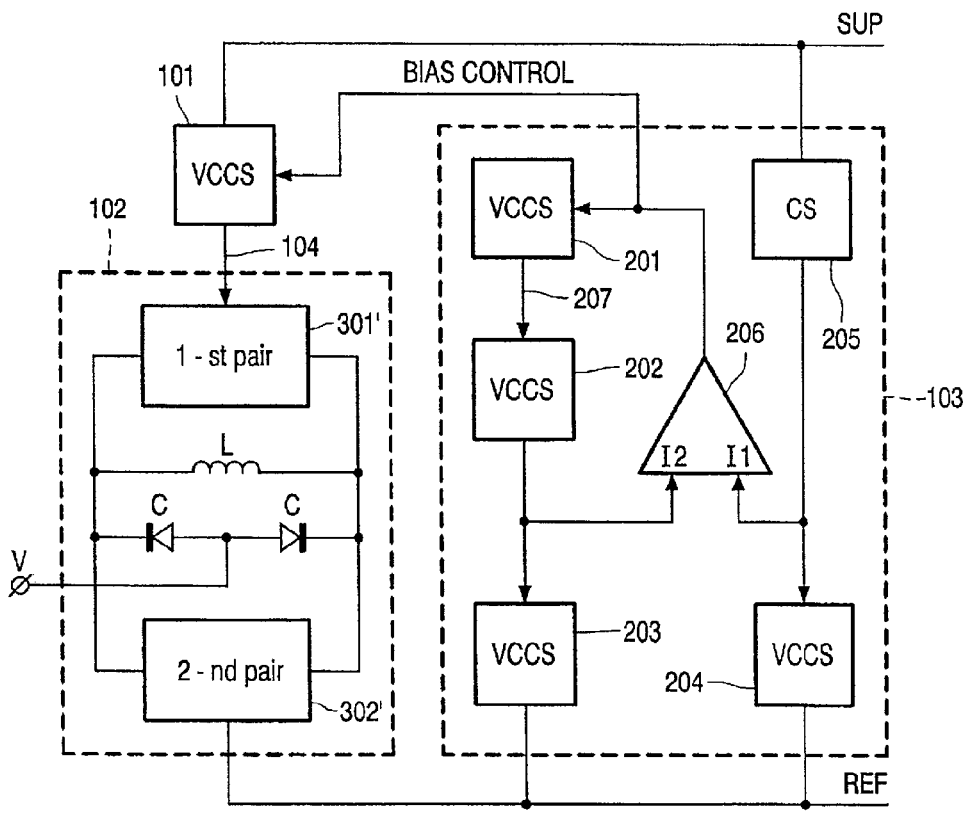
FIG. 2 depicts a more detailed diagram of the LCCO according to the invention.

FIG. 2 depicts a more detailed diagram of the LCCO according to the invention. The VCO 102 is realized with a first pair 301 of VCCS of the first type and a second pair (302) of VCCS of the second type, comprising a resonator realized, for illustrative purposes, with a LC tank circuit that determines it's oscillation frequency. It is provided a control signal V that controls the oscillation frequency of the LCCO. For illustrative purposes, the control signal is a voltage, but depending on the practical devices used in the LCCO, it's oscillation frequency can be modified mechanically, optically, thermally. The LCCO further comprises the RSBM 103 comprising a differential voltage controlled voltage source (VCVS) 206 having a first input I1 and a second input I2 and delivers at it's output a signal BIAS CONTROL that controls the supply current 104 of the VCO 102 via the VCCS 101. A current source 205 of the first type coupled with a fifth VCCS 204 of the second type in order to provide a first reference voltage at the first input I1 of the VCVS 206. The BIAS CONTROL signal also controls a current 207 provided by a second VCCS 201 of the first type that is coupled with a third VCCS 202 of the second type, the third VCCS 202 being coupled with a fourth VCCS of the second type 203 and the second input terminal of the VCVS 206. The VCCS used in the RSBM are replicas at a different scale of that used in the VCO, the currents circulating through them being proportional each other. For example, if a current sourced or sinked by a VCCS is $2I_0$ then the replica scaled VCCS sources or sinks a current $2I_0/m$, m being the scale factor. In the case of the circuit depicted in the FIG. 2 the current 207 is the replica scaled of the current 104.

Figure 3:
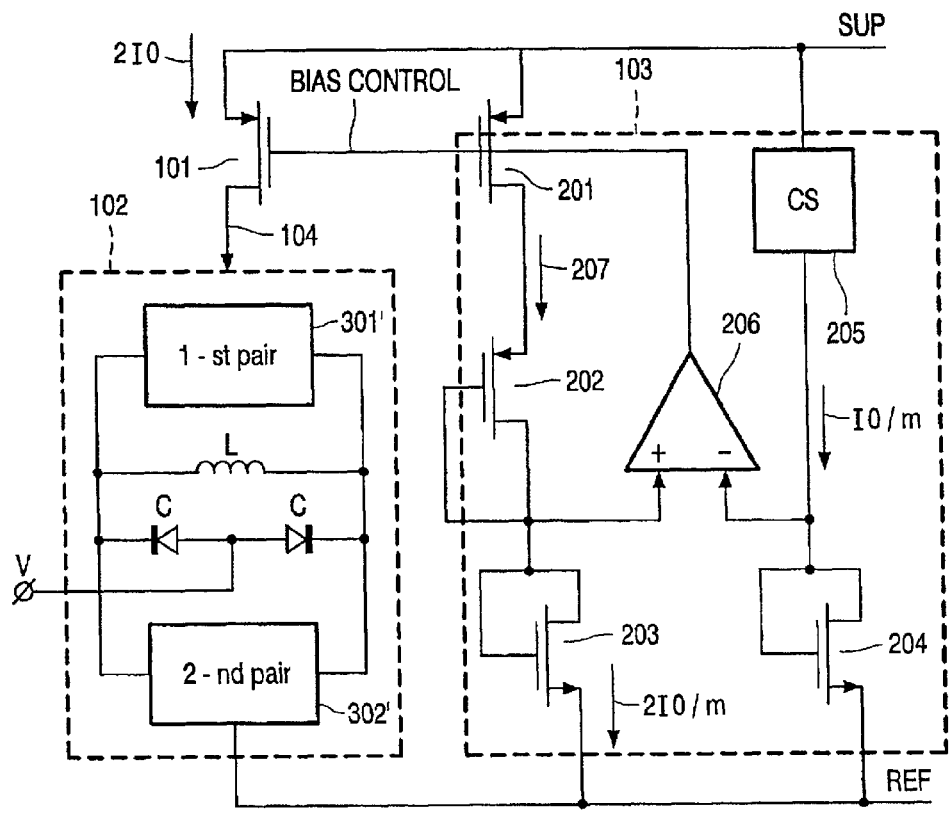
FIG. 3 depicts a CMOS implementation of the LCCO according to one embodiment of the invention.

FIG. 3 depicts a CMOS implementation of the LCCO according to one embodiment of the invention. For illustrative purposes, CMOS transistors were used. However, the circuit may be implemented either in bipolar, CMOS or BiCMOS technologies, or a combination there of. For bipolar transistors, the control electrode, first main electrode and second main electrode correspond to the base, emitter and collector, respectively. For MOS transistors, the control electrode, first main electrode and second main electrode correspond to the gate, source and drain, respectively.

The first VCCS 101, the second VCCS 201 and the third VCCS 202 are p-MOS transistors, but any other VCCS of the first type can be used instead. The fourth VCCS 203 and the fifth VCCS 204 are n-MOS transistors but any other VCCS of the second type can be used instead. The differential VCVS 206 is an operational amplifier but any other differential VCVS can be used instead as, for example, an operational transconductance amplifier ended on a capacitor, or any other equivalent solutions.

The current 207 through the second VCCS is $2I_0/m$ and the current through the fifth VCCS 204 is $I_0/m$. Under this circumstances, the BIAS CONTROL signal generated by the VCVS 206 is proportional to $I_0/m$ which is a replica scaled current that flows through the first pair 301 of VCCS and the second pair 302 of VCCS in the VCO 102. In this preferred embodiment of the invention the scaling is obtained using transistors with the same length and with their width scaled with a factor m.

The BIAS CONTROL signal modifies in the same way the supply current 104 of the VCO 102 and the replica current 207 in the VCCS 201 with the process and temperature variations. In this way the common mode voltage of the first pair (301) of VCCS and of the second pair (302) of VCCS is maintained constant. This improves considerably the phase noise margin, too. It should be pointed out here that the current source 105 and the fifth VCCS (204) may be replaced with a band gap reference voltage source that provides a better temperature behavior of the circuit. Furthermore, if the control signal V is generated using this band gap reference voltage, the oscillation frequency stability versus temperature is improved, too.

Figure 4:
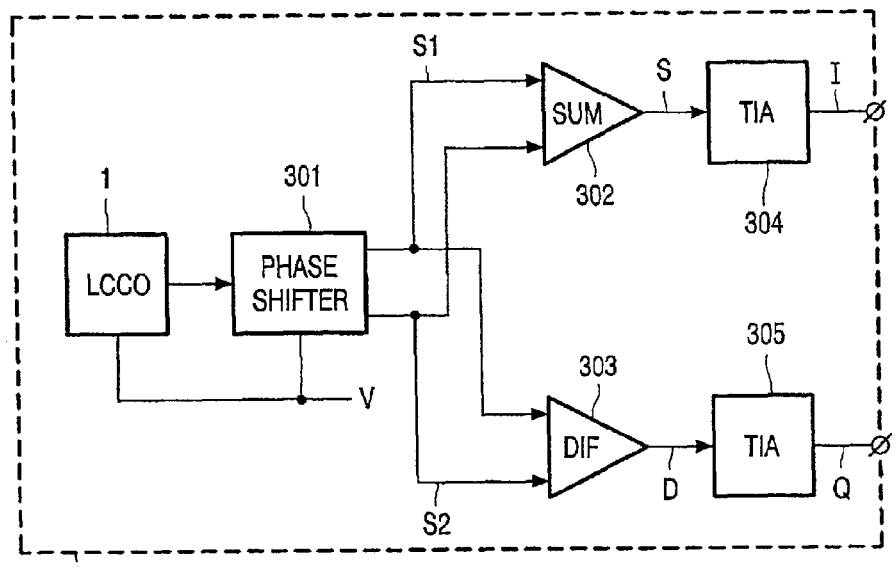
FIG. 4 depicts a module that uses a LCCO.

FIG. 4 depicts a module 300 that uses a LCCO, which is essentially a quadrature oscillator. In the module 300 the LCCO 1 is coupled with a phase shifter 301 and they are controlled simultaneously by the same control signal V. The phase shifter 301 provides a first S1 and a second S2 intermediate signals at it's outputs that are mutually in quadrature. The phase shifter can be realized as a controllable all pass filter but any other controllable quadrature phase shifter can be used instead. The intermediate signals S1 and S2 are used as input signals in an adder SUM 302 obtaining a signal S and in a subtractor DIF 303 obtaining a signal D. The S signal is amplified with a first amplifier TIA 304 obtaining an output signal I and the signal D is amplified with a second amplifier TIA 305 obtaining an output signal Q. The two output signals are mutually in quadrature and, under these circumstances, the module 300 is a quadrature oscillator. In a preferred embodiment of the module the TIA 304 and 305 are disclosed in PH-NL010020EPP.

Figure 5:
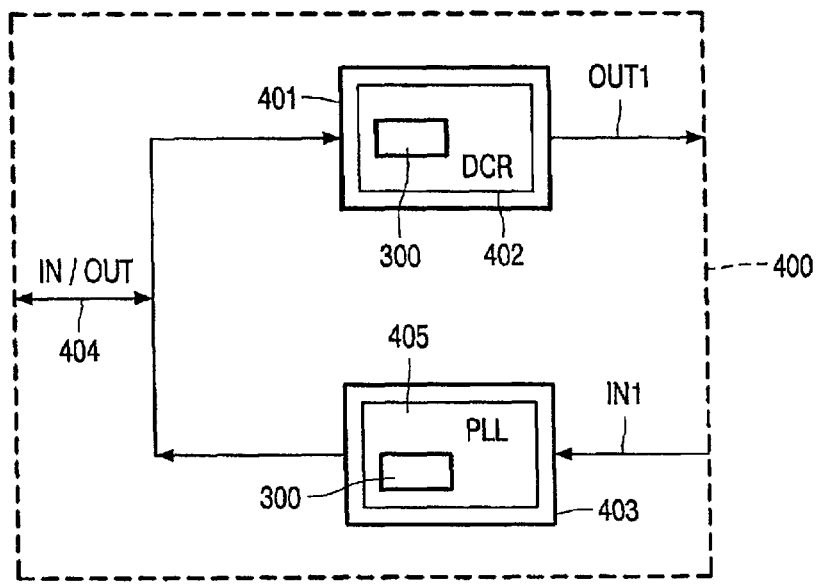
FIG. 5 depicts a communication arrangement for communicating via a bi-directional channel.

FIG. 5 depicts a communication arrangement 400 for communicating via a bi-directional channel 404. The communication arrangement is characterized in that it comprises a receiver 401 that comprises a data and clock recovery DCR circuit 402 comprising the module 300, the receiver being arranged for generating an output vector of signals OUT1 by combining a received signal IN, received from the channel 404, with the periodical signals I and Q, the arrangement further comprising an emission module 403 for emitting an emission signal OUT to the channel 404, the emission module generating the emission signal by combining the periodical signals I and Q with an input signal vector IN1 in a phase locked loop PLL circuit 405 that contains the module 300.

In a preferred embodiment of the invention, the output vector OUT1 is a vector of signals obtained in a Low IF/Zero IF receivers, SONET/SDH applications, the input vector of signals IN1 is a suitable coded analogical signal, the bi-directional communication channel 404 is an optical network and the arrangement 400 is a transceiver used in optical communication networks.

Figure 6:
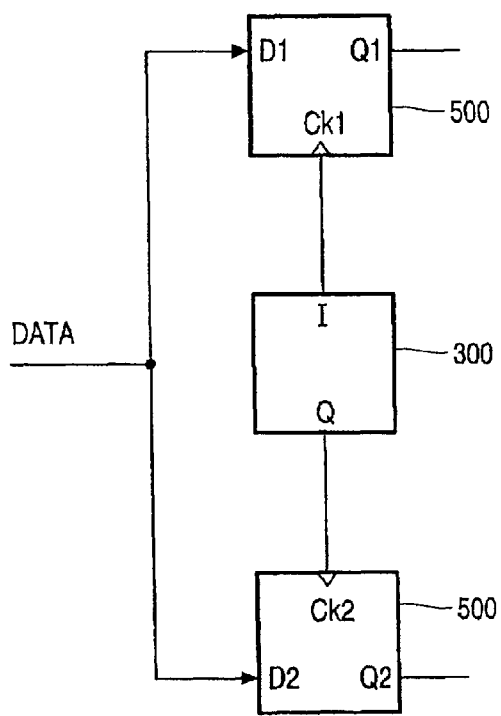
FIG. 6 depicts an interleaved phase/frequency detector in another embodiment of the invention.

FIG. 6 depicts an interleaved phase/frequency detector in another embodiment of the invention. The LCCO 300 output signals I and Q are coupled with a first and a second D flip-flops (DFF) 500. The first DFF (500) has an input D1 coupled with an input signal DATA and a Clock input Ck1 coupled with the signal I from the LCCO generating a signal at an output terminal Q1 which is almost in phase with the positive edge of the signal I. The second DFF (500) has an input D2 coupled with an input signal DATA and a Clock input Ck2 coupled with the signal Q from the LCCO generating a signal at an output terminal Q2 which is almost in phase with the positive edge of the I signal. The phase/frequency detector is a part of the DCR 402 and the PLL 405. Furthermore the signal DATA is a component either of vector IN1 or IN.

Figure 7:
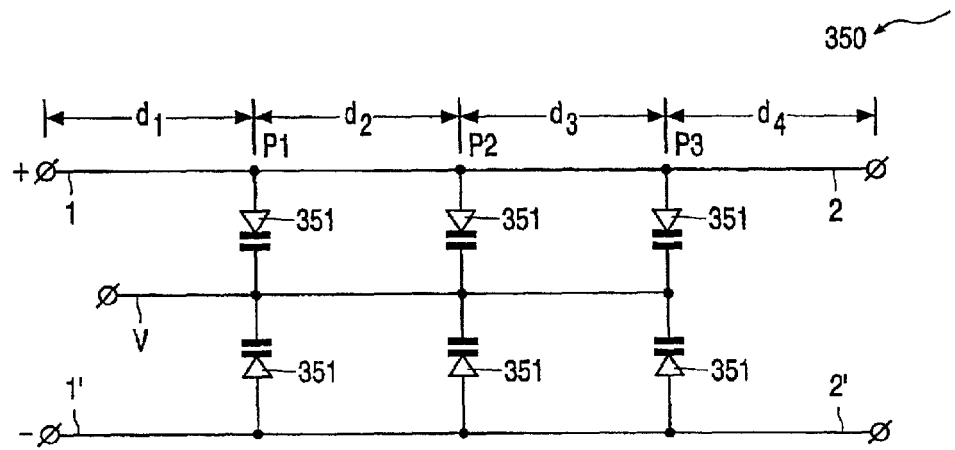
FIG. 7 depicts a portion of a delay line used in phase shifter, according to the invention.

FIG. 7 depicts a portion of a delay line 350 used in a phase shifter 301, according to the invention. The portion of the delay line 350 comprises a plurality of voltage controlled capacitors 351, each of the voltage controlled capacitors 351 having an anode and a cathode. The cathodes of the voltage controlled capacitors 351 are coupled to each other. A capacitance C of the voltage-controlled capacitor 351 is controlled via the control voltage V applied to it's cathode. A first plurality of the anodes of the voltage controlled capacitors 351 is coupled to a first delay line (1–2), said first delay line (1–2) being coupled to a first input terminal 1 and to a first output terminal 2. A second plurality of the anodes of the voltage controlled capacitors 351 is coupled to a second delay line (1'–2'), said second delay line (1'–2') being coupled to a second input terminal 1' and to a second output terminal 2'. (first number-second number) identifies a delay line between a terminal labeled with the first number and a terminal labeled with the second number. A distance between two consecutive anodes of either the first portion of delay line (1-2) and the second portion of delay line (1'–2') is identified as $d_i$. For instance in FIG. 7 the distances $d_2$, $d_3$ are between two consecutive anodes of two consecutive voltage controlled capacitors 351. The distance $d_1$, is between the first input terminal 1 and anode of a first anode of a voltage controlled capacitor 351. The distance $d_4$ is between a last anode of a voltage controlled capacitor 351 and the first output terminal 2. A portion of a delay line could be modeled as a resistor, as an inductor or a combination thereof. The choice of a model or another depends on some physical characteristics of the delay line as length, width, material of the delay line and of the frequency of the signals flowing in the delay line. A portion of a delay line $d_i$ could be identified as e.g. a resistor having a resistance $R_i$ as an inductor having an inductance $L_i$ or a combination thereof. Both the resistance $R_i$ and the inductance $L_i$ are proportional to the length of the portion of the delay line $d_i$. A portion of the delay line of length $d_i$ coupled to a voltage controlled capacitor 351 is called hereinafter d–C cell. A delay of a d–C cell could be written as in relation (1).

$$t_i \approx \frac{1}{d_i C_i} \quad i = 1, 2, 3 \tag{1}$$

In (1) "≈" means "proportional to". In a particular case the distances $d_i$ could be equal to each other and further equal to d. The voltage controlled capacitors 351 could also have a capacitance equal to each other and equal to C. If N distances d and N voltage controlled capacitors 351 are considered the total delay is as in relation (2).

$$t \approx N t_e \tag{2}$$

where $$t_e \approx \frac{1}{dC} \tag{3}$$

It is further observed that the delay line portion 350 in FIG. 7 is a differential one being suitable for differential systems. In single-ended applications either the terminals 1' and 2' or the terminals 1 and 2 are grounded and either the second delay line (1'–2') or the first delay line (1-2) are replaced by a relatively low resistance connection respectively.

Figure 8:
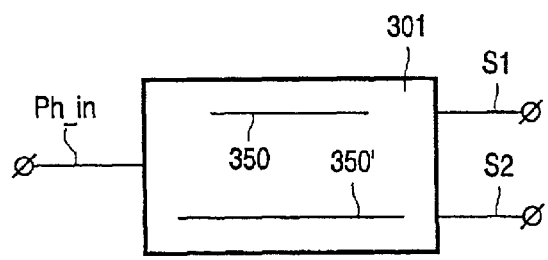
FIG. 8 depicts a delay lines arrangement used in phase shifter, according to the invention.
Figure 9:
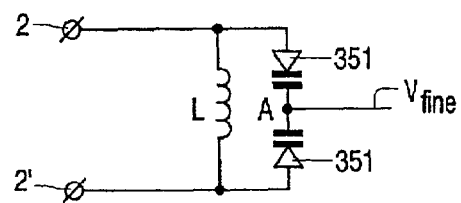
FIG. 9 depicts a LC tank circuit used in the phase shifter, according to the invention.

The portion of delay line 350 shown in FIG. 7 could be used in a phase shifter 301 as shown in FIG. 8. FIG. 8 depicts a delay lines arrangement used in the phase shifter 301, according to the invention. The delay lines arrangement comprises a first portion of delay line 350 and a second portion of delay line 350'. The second portion of delay line 350' has a different number of d–C cells than the first portion of delay line. At an output of the phase shifter 301 the first intermediate signal S1 and the second intermediate signal S2 are obtained. An input signal Ph_in is inputted to the first portion of delay line 350 and to the second portion of delay line 350', respectively. The input signal Ph_in is differently delayed by the portions of delay lines 350 and 350' and a delay difference between the first intermediate signal S1 and the second intermediate signal S2 is obtained. The delay difference is equivalent to a phase shift and therefore the first intermediate signal S1 and the second intermediate signal S2 are phase shifted relatively to each other. A phase shift between the first intermediate signal and the second intermediate signal is therefore proportional to the difference in number of d–C cells included in the delay lines portions 350 and 350'. For example the first portion of delay line 350 could comprise 5 d–C cells and the second portion of delay line 350' could comprise 1 d–C cell when SiGe BiCMOS technology is considered. For increasing a flexibility in applications it is desirable that the phase-shift between the first intermediate signal S1 and the second intermediate signal S2 to be adjustable for obtaining a precise phase shift e.g. 90 degrees i.e. quadrature signals. This could be achieved using a controllable tank circuit as shown in FIG. 9. The tank circuit comprises an inductor having an inductance L coupled to a pair of voltage controlled capacitors 351 having their cathodes coupled together. The cathodes are further coupled to a fine control terminal. A voltage $V_{fine}$ inputted to the fine control terminal controls the capacitance of the voltage controlled capacitors 351. The tank circuit introduces an additional phase shift to a portion of delay line. The tank circuit is coupled to the first output terminal 2 and to the second output terminal 2' of either the first portion of delay line 350 or the second portion of delay line 350'.

It is remarked that the scope of protection of the invention is not restricted to the embodiments described herein. Neither is the scope of protection of the invention restricted by the reference numerals in the claims. The word 'comprising' does not exclude other parts than those mentioned in a claim. The word 'a(n)' preceding an element does not exclude a plurality of those elements. Means forming part of the invention may both be implemented in the form of dedicated hardware or in the form of a programmed general purpose processor. The invention resides in each new feature or combination of features.

What is claimed is:

1. A LC controllable oscillator (LOCO) (1) comprising:
    a voltage controlled oscillator (VCO) (102), a first voltage controlled current source (VCCS) of a first type (101) for supplying a current (104) to the VCO (102), the VCO being realized with a first pair (301) of VCCS of the first type coupled with a second pair (302) of VCCS of a second type and a LC resonator adapted for generating a periodical oscillation frequency which is controllable by a control signal (V),
    a first (SUP) conductor and a second (REP) conductor for connection to an external direct voltage source (105) characterized in that
    the LCCO (1) further comprises a replica scaled bias module (RSBM) (103) supplied from the external voltage source (105) via the first conductor (SUP) and the second conductor (REF),
    the RSBM (103) is conceived to generate a control signal (BIAS CONTROL) for controlling the supplied current (104) delivered by the first VCCS (101) to the VCO (102) and the RSBM (103) further comprises a current source of the first type (205) and a third VCCS of the second type (204) that are coupled in a first input node (I1) of a differential voltage controlled voltage source (VCVS) (206) that further comprises a second input (I2) that is coupled with the second VCCS (203) for supplying the signal (BIAS CONTROL) for controlling the supply current (104) in the VCO (102).

2. A LCCO (1) as claimed in claim 1 wherein the RSBM (103) comprises a fourth (201), a fifth (202) and the second (203) VCCS, the fourth and fifth VCCS being of the first type, the second VCCS being of the second type.

3. A module (300) comprising a LOCO (1) as claimed in claim 1 coupled with a phase shifter (301), controlled by the control signal (V), the phase shifter (301) being conceived to provide a first intermediate signal (S1) and a second intermediate signal (S2) to an adder (SUM) (302), for adding the intermediate signals S1 and S2 to each other for obtaining a signal (S) to be supplied to a first wide band amplifier (TIA) (304) for obtaining a first output signal (I), and to a subtraction circuit (DIF) (303) for subtracting the intermediate signals S1 and S2 from each other for obtaining a signal (D) to be supplied to a second wide band amplifier (TIA) (305) for obtaining a second output signal (Q).

4. A module (300) as claimed in claim 3 characterized in that the first and second intermediate signals S1 and S2 are mutually phase shifted with 90 degrees.

5. A module (300) as claimed in claim 3 characterized in that the output signals (I) and (Q) are periodical and mutually in quadrature.

6. A communication arrangement (400) for communicating via a bi-directional communication channel (404), characterized in that it comprises a receiver (401) that comprises a data and clock recovery (DCR) circuit (402) comprising a module (300) as claimed in claim 5, the receiver being arranged for generating an output vector of signals (OUT1) by combining a received signal (IN) received from the bi-directional communication channel (404) with the periodical signals (I) and (Q), the arrangement further comprising an emission module (403) for emitting an emission signal (OUT) to the bi-directional communication channel (404), the emission module being conceived to generate the emission signal by combining the periodical signals (I) and (Q) with an input signal vector (IN1) in a phase locked loop (PLL) circuit (405) that contains the module (300).

* * * * *